(12) United States Patent
Robertson

(10) Patent No.: US 6,214,229 B1
(45) Date of Patent: Apr. 10, 2001

(54) TREATMENT SYSTEM FOR REMOVING PHOSPHORUS

(75) Inventor: William Dean Robertson, Waterloo (CA)

(73) Assignee: University of Waterloo, Waterloo (CA)

( * ) Notice: Subject to any disclaimer, the term of this patent is extended or adjusted under 35 U.S.C. 154(b) by 0 days.

(21) Appl. No.: 09/190,415

(22) Filed: Nov. 3, 1998

(30) Foreign Application Priority Data

Nov. 5, 1997 (GB) ................................... 9723347

(51) Int. Cl.[7] .................................................. C02F 1/58
(52) U.S. Cl. .................... 210/605; 210/617; 210/630; 210/631; 210/717; 210/719; 210/721; 210/747; 210/906
(58) Field of Search ................................... 210/605, 617, 210/630, 631, 667, 717, 719, 721, 724, 747, 906

(56) References Cited

U.S. PATENT DOCUMENTS

| | | | |
|---|---|---|---|
| 4,029,575 | * | 6/1977 | Bykowski et al. ...................... 210/16 |
| 4,167,479 | * | 9/1979 | Besik ........................................ 210/7 |
| 4,184,947 | * | 1/1980 | Demisch ................................ 210/18 |
| 5,271,848 | * | 12/1993 | Smith et al. ......................... 210/702 |
| 5,318,699 | * | 6/1994 | Robertson et al. ................... 210/151 |
| 5,620,893 | * | 4/1997 | Hogen et al. ......................... 435/262 |
| 5,707,513 | * | 1/1998 | Jowett et al. ......................... 210/150 |
| 5,783,088 | * | 7/1998 | Amonette et al. ..................... 210/679 |
| 5,876,606 | * | 3/1999 | Blowes et al. ....................... 210/679 |
| 5,980,739 | * | 11/1999 | Jowett et al. ......................... 210/151 |

* cited by examiner

*Primary Examiner*—Peter A. Hruskoci
(74) *Attorney, Agent, or Firm*—Anthony Asquith & Co.

(57) ABSTRACT

A new method of forming mask ROM in the manufacture of an integrated circuit device has been achieved. A semiconductor substrate is provided with field oxide areas defined and a gate oxide layer overlying the semiconductor substrate. A gate electrode layer is deposited overlying the gate oxide layer. The gate electrode layer and the gate oxide layer are patterned to form gate electrodes. Ions are implanted to form source and drain junctions. A buffer layer is deposited overlying the gate electrodes, the source and drain junctions, and the field oxide areas. The buffer layer is etched down to expose the gate electrodes while leaving a protective thickness of the buffer layer overlying the source and drain junctions. Ions are implanted through the gate electrodes into the semiconductor substrate to selectively code the mask ROM devices and to complete the mask ROM devices in the manufacture of the semiconductor device. A coding mask controls the ion implantation to selectively code the mask ROM. The buffer layer prevents the ions from penetrating into the source and drain areas.

20 Claims, 4 Drawing Sheets

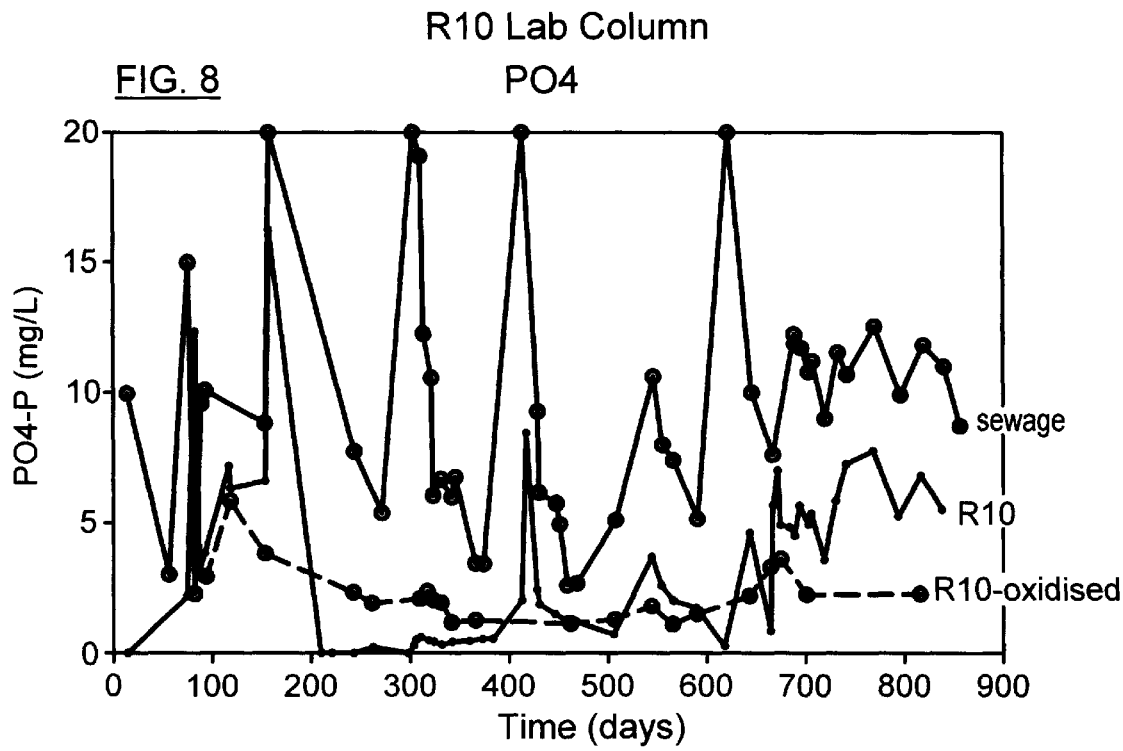
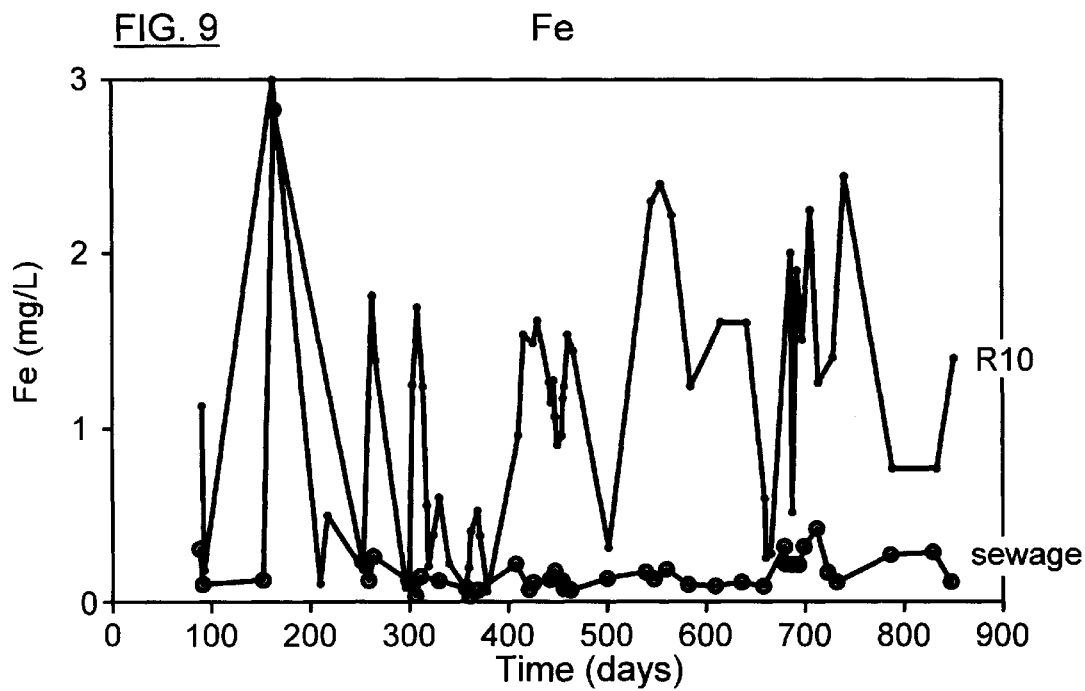
Comparison of PO4 and Fe concentrations in filtered raw sewage dosed to a laboratory sediment column before (sewage) and after (RID) entering an anaerobic container with RID media and after RID effluent is oxidised.

TREATMENT SYSTEM FOR REMOVING PHOSPHORUS

BACKGROUND OF THE INVENTION (1) Field of the Invention

The invention relates to a method of fabricating semiconductor structures, and more particularly, to a method of forming mask read-only memory (ROM) devices in the manufacture of integrated circuit devices.

(2) Description of the Prior Art

Mask read-only memory (ROM) devices are memory arrays where the contents are permanently hard coded. Mask ROM is used, for example, for core or boot-up programming in microcomputer systems. Though the contents of the memory array cannot be altered, the mask ROM integrated circuit can be produced for less money than a comparably sized programmable device, such as electrically erasable programmable ROM (EEPROM). In addition, the data in a mask ROM is typically less prone to data errors resulting from programming problems or data loss due to environmental conditions.

The key technology in the mask ROM is typically the MOS transistor. Each cell in the mask ROM array is comprised of a MOS transistor. Each transistor has been pre-programmed to a given state during the manufacturing process. The state of the transistor, either logical "0" or "1," is determined by the fixed threshold voltage of the transistor.

Referring now to FIG. 1, a cross sectional representation of a prior art integrated circuit device is illustrated. The cross section shows a partially completed mask ROM device of the prior art. A semiconductor substrate 10 is shown. Field oxide (FOX) regions 14 have been defined in the semiconductor substrate 10. The active device area for the mask ROM is the area of the substrate 10 between the field oxide regions 14. A sacrificial oxide layer 18 has been formed overlying the semiconductor substrate 10.

In the typical prior art process, a coding implantation 26 is performed at this part of the mask ROM process. In the coding implantation 26, doping ions are implanted into the semiconductor substrate 10 where defined by the coding mask 22. The coding implantation 26 will alter the voltage threshold ($V_t$) of the completed MOS transistor by creating a coding threshold region 30 near the surface of the semiconductor substrate 10 where the doping concentration is either greater or lesser than the comparable region in non-implanted devices.

A typical mask ROM scenario could be the assignment of a logical "1" to transistors with high $V_t$ and a logical "0" to transistors with low $V_t$. If the ion implantation used in the coding implant will cause the $V_t$ to increase, then the mask used to pattern the photoresist 22 will have openings only overlying logical "1" transistors.

Referring now to FIG. 2, after the coding implantation, the sacrificial oxide layer 18 is removed. A gate oxide layer 32 is formed overlying the semiconductor substrate 10. A polysilicon layer 38 is deposited overlying the gate oxide layer 32. The polysilicon layer 38 and the gate oxide layer 32 are then patterned to form the gate electrode 38 for the mask ROM device. Additional processing steps for forming lightly doped drains, sidewall spacers, and source and drain junctions, would also occur but are not illustrated here.

Note that the coding implantation occurs relatively early in the mask ROM manufacturing sequence. This is an important observation. The data contents, often a microcomputer program, are permanently encoded into the mask ROM as soon as the coding implant is performed. If the designers of the mask ROM application require a programming change after the integrated circuit or circuit batch has passed the coding implantation, it is too late. The circuits either must be used as they were originally coded, or they must be scrapped. In practice, code changes are a common occurrence. Preferably, the coding process step would be as late in the processing sequence as possible. A relatively later coding step in the process helps to prevent scrap, provides better service to the applications customer, and increases the economic viability of the mask ROM manufacturer.

Several prior art approaches disclose methods to form mask ROM devices in the manufacture of an integrated circuit device. U.S. Pat. No. 5,378,647 to Hong discloses a method to form a mask ROM device using polysilicon bit lines and a back gate construction. The bit pattern is formed by selective removal of the polysilicon layer. U.S. Pat. No. 5,589,414 to Wann et al discloses a prior art method to code a mask ROM by selectively implanting the channel area through the polysilicon gate. Photoresist is used to protect non-implanted gates and source and drain regions. This invention also teaches a method to code a mask ROM where a thin first polysilicon gate layer is formed. The code implant is performed through the thin polysilicon gate. The second polysilicon layer is deposited, and the transistor is completed. U.S. Pat. No. 5,751,040 to Chen et al teaches a process to form a mask ROM device with a vertical channel. U.S. Pat. No. 5,831,314 to Wen discloses a process to form a trench-shaped ROM device.

SUMMARY OF THE INVENTION

A principal object of the present invention is to provide an effective and very manufacturable method of forming mask read-only memory (ROM) devices in the manufacture of integrated circuits.

A further object of the present invention is to provide a method to code mask ROM devices later in the processing sequence.

Another further object of the present invention is to provide a method to code mask ROM devices by ion implantation after formation of the gate electrode and the source and drain regions.

Another further object of the present invention is to protect the mask ROM source and drain regions with a buffer layer to prevent bit-line to bit-line code leakage due to the high energy ion implantation used in coding.

In accordance with the objects of this invention, a new method of forming mask ROM in the manufacture of an integrated circuit device has been achieved. A semiconductor substrate is provided with field oxide areas defined and a gate oxide layer overlying the semiconductor substrate. A gate electrode layer is deposited overlying the gate oxide layer. The gate electrode layer and the gate oxide layer are patterned to form gate electrodes. Ions are implanted to form source and drain junctions. A buffer layer is deposited overlying the gate electrodes, the source and drain junctions, and the field oxide areas. The buffer layer is etched down to expose the gate electrodes while leaving a protective thickness of the buffer layer overlying the source and drain junctions. Ions are implanted through the gate electrodes into the semiconductor substrate to selectively code the mask ROM devices and to complete the mask ROM devices in the manufacture of the semiconductor device. A coding mask controls the ion implantation to selectively code the mask ROM. The buffer layer prevents the ions from penetrating into the source and drain areas.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of mask ROM in the manufacture of an integrated circuit device. It should be clear to those experienced in the art that the present invention can be applied and extended without deviating from the scope of the present invention.

Figure 3:
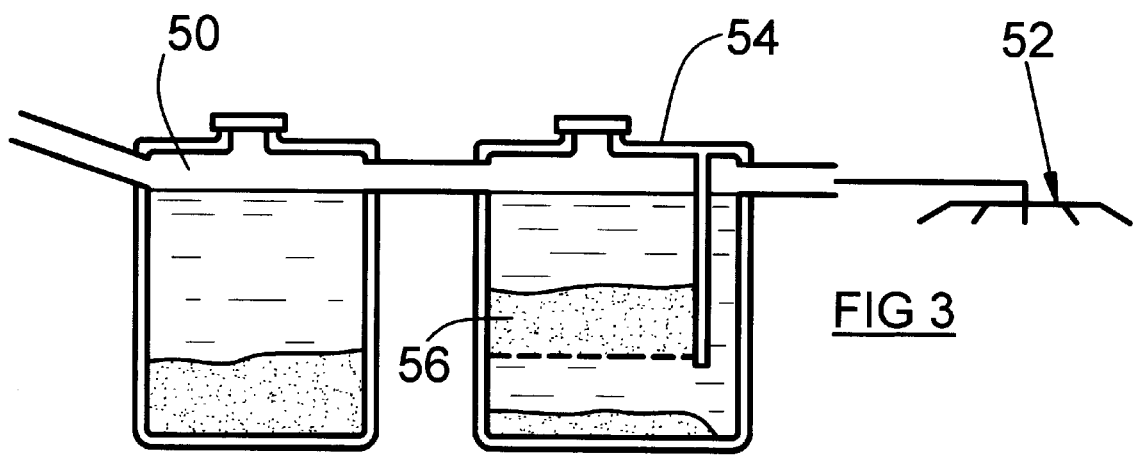
FIGS. 3 through 9 schematically illustrate in cross-section the preferred embodiment of the present invention.

Referring now particularly to FIG. 3, there is shown a cross section of a partially completed integrated circuit device of the preferred embodiment. A semiconductor substrate 50, typically consisting of monocrystalline silicon, is provided. Field oxide areas 54 are defined in the semiconductor substrate 50. The areas between the field oxide areas 54 are the active areas of the devices. A gate oxide layer 58 is formed overlying the semiconductor substrate 50. The gate oxide layer 58 serves as the electrode dielectric for the subsequently formed mask ROM device. The gate oxide layer 58 is formed by a conventional process such as low-pressure chemical vapor deposition (LPCVD) or by thermal oxidation. The gate oxide layer 58 is preferably formed to a thickness of between about 100 Angstroms and 200 Angstroms.

An important feature of the present invention is the gate electrode layer 62. The gate electrode layer 62 is deposited overlying the gate oxide layer 58. The gate electrode layer 62 may comprise one of the group containing: polysilicon, polycide and silicide.

The thickness of the gate electrode layer 62 is a critical component in the present invention. The process of the present invention performs the coding ion implantation after the formation of the gate electrodes and the source and drain junctions. Therefore, the implanted ions must pass through the gate electrodes and into the underlying channel regions in the semiconductor substrate 50. As the thickness of the gate electrode layer 62 is increased, the energy required for the ion implantation also increases. Unfortunately, if the ion implantation energy is too great, the ions will also penetrate into unwanted areas and possibly cause junction leakage between bit-lines. Finally, if the gate electrode layer 62 is too thin, the resistivity of the gates will increase and cause a degradation of circuit performance. The gate electrode layer 62 preferably comprises polysilicon deposited by LPCVD to a thickness of between about 2,500 Angstroms and 3,500 Angstroms.

Figure 4:
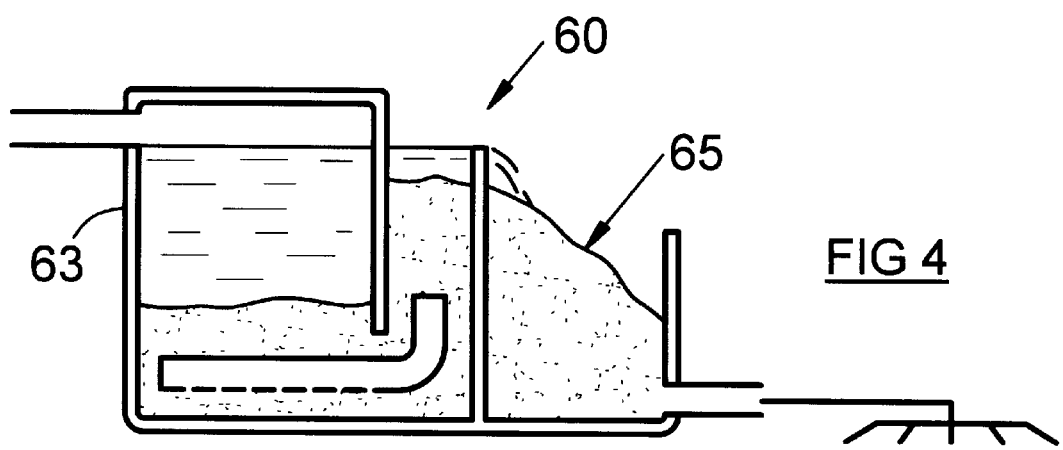

Referring now to FIG. 4, the gate electrode layer 62 and the gate oxide layer 58 are patterned to form gate electrodes and word lines 62 for the mask ROM device. The patterning is conventionally performed using a photolithographic sequence of coating with photoresist, exposing through a mask, developing, and etching.

Figure 5:
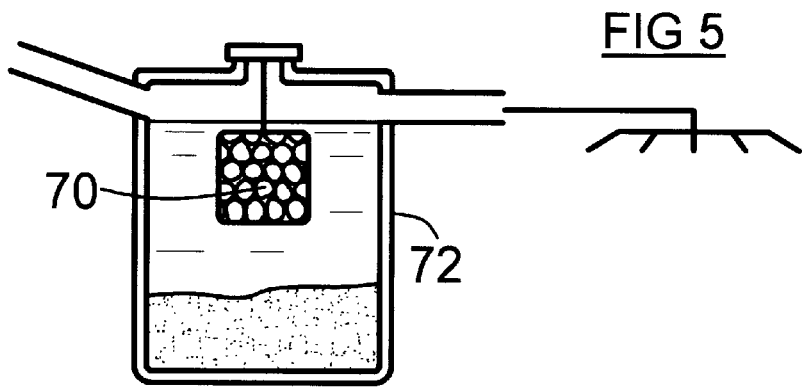

Referring now to FIG. 5, the mask ROM device is depicted after implantation of lightly doped drains 66, formation of sidewall spacers 74, and implantation of source and drain junctions 70. The lightly doped drains 66 are conventionally implanted and are self-aligned to the gate electrodes 62. The sidewall spacers 74 may comprise silicon nitride or silicon dioxide. The sidewall spacers 74 are conventionally formed using a plasma sputter-deposition process. The source and drain junctions 70 are conventionally implanted and are self-aligned to the sidewall spacers 74.

Figure 6:
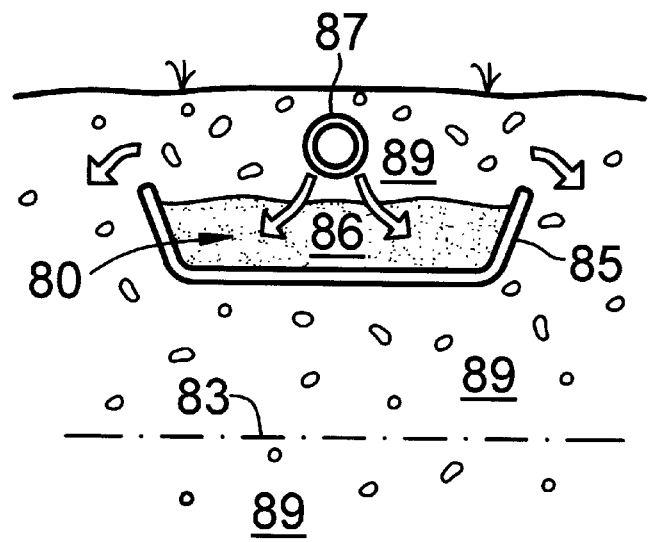

Referring now to FIG. 6, an important feature of the present invention is illustrated. A buffer layer 78 is deposited overlying the gate electrodes 62, the source and drain junctions 70, and the field oxide areas 54. The buffer layer 78 will protect the source and drain junctions 70 during the subsequent coding ion implantation. The buffer layer 78 will prevent ion infiltration into unwanted areas of the circuit. The buffer layer 78 preferably comprises a bottom anti-reflective coating (BARC) that may be an organic material. The buffer layer 78 may also comprise a spin-on glass (SOG) material. The buffer layer 78 is preferably BARC deposited to a thickness of between about 1,000 Angstroms and 2,500 Angstroms.

Figure 7:
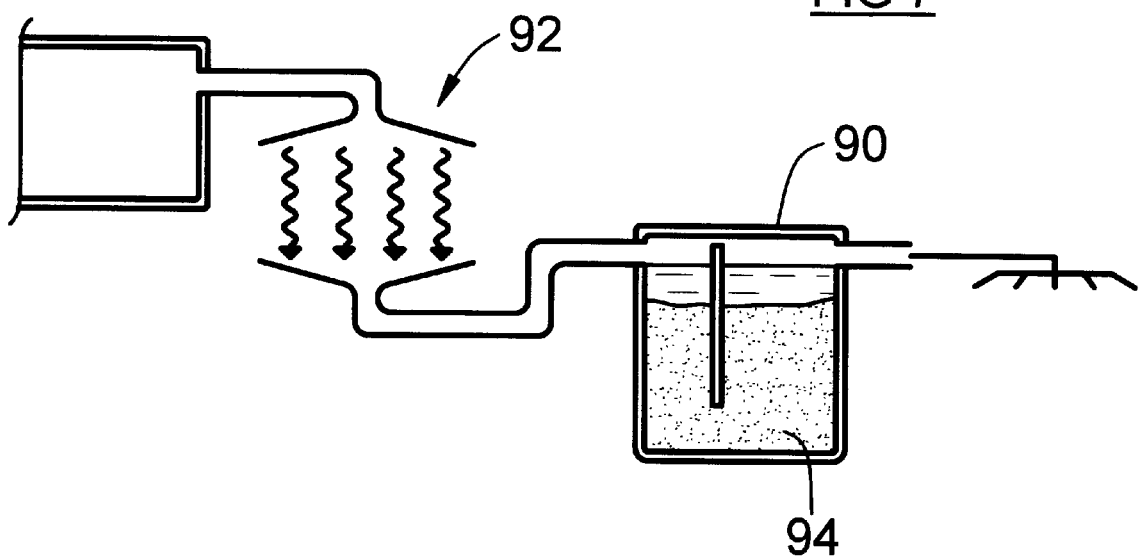
Figure 1:
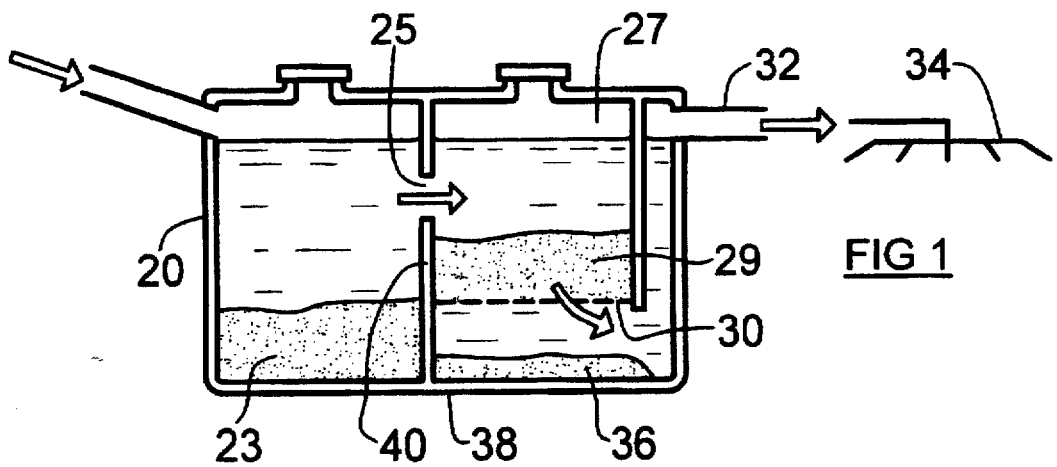
Figure 2:
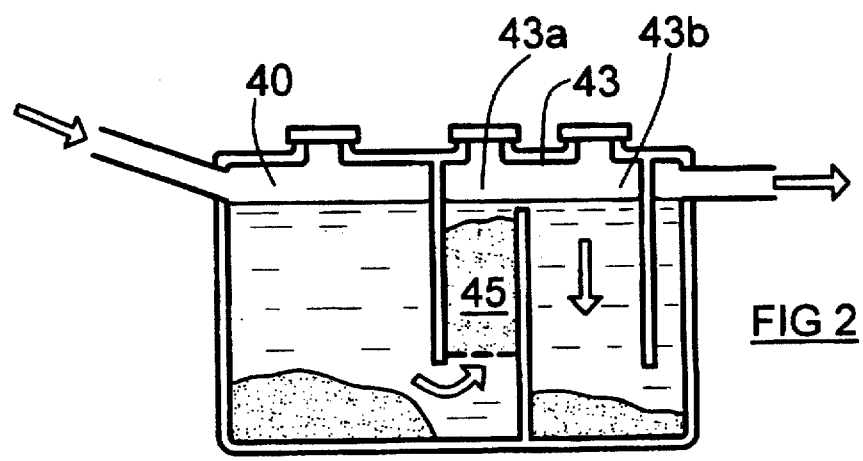
Figure 3:
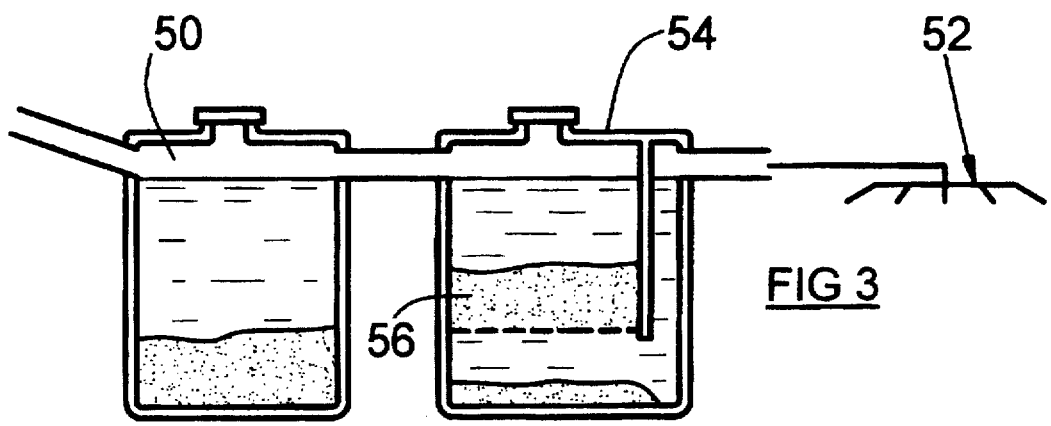
Figure 4:
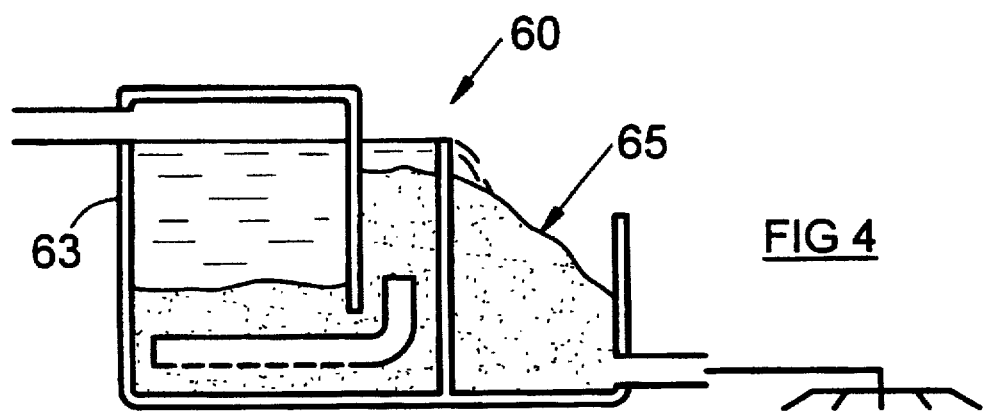
Figure 5:
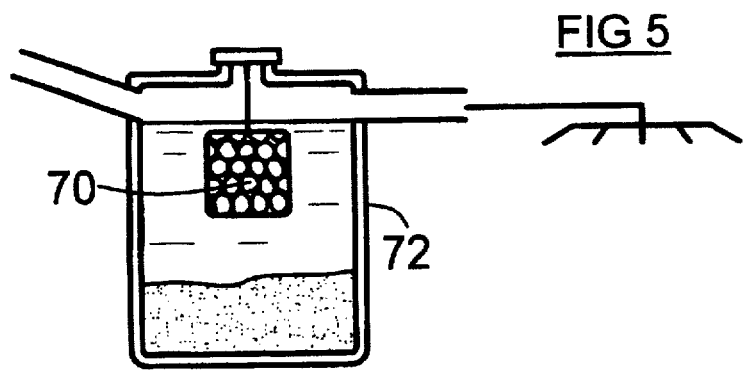
Figure 6:
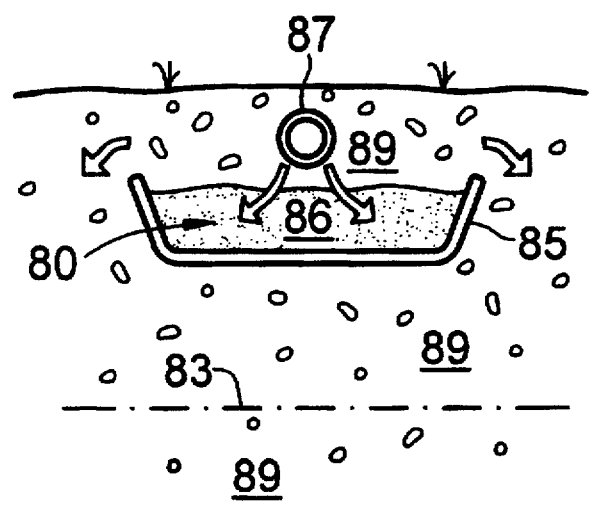
Figure 7:
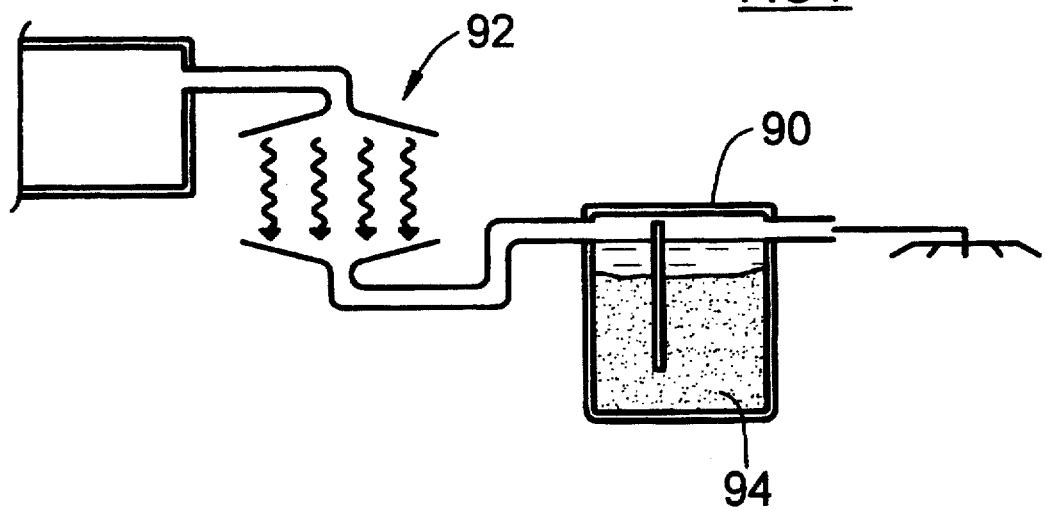

Referring now to FIG. 7, another important part of the present invention is illustrated. The buffer layer 78 is etched down to expose the gate electrodes 62 while leaving a protective thickness of the buffer layer 78 overlying the source and drain junctions. The buffer layer 78 must be removed from the gate electrodes 62 so that it does not inhibit the implantation of ions through the gate electrode layer 62 during the code implantation. In addition, the etching down removes any oxide that may have formed over the gate electrode 62 and thus improves the implantation capability. Conversely, a significant thickness of the buffer layer 78 must be left overlying the source and drain junctions 70 in the semiconductor substrate 50 to protect and shield this part of the device from the implantation.

The etching down step is preferably performed using a dry etching process with an $O_2$ base. After the etching down step, a protective thickness of between about 700 Angstroms and 1,500 Angstroms of the buffer layer 78 is left overlying the source and drain junctions.

Figure 8:
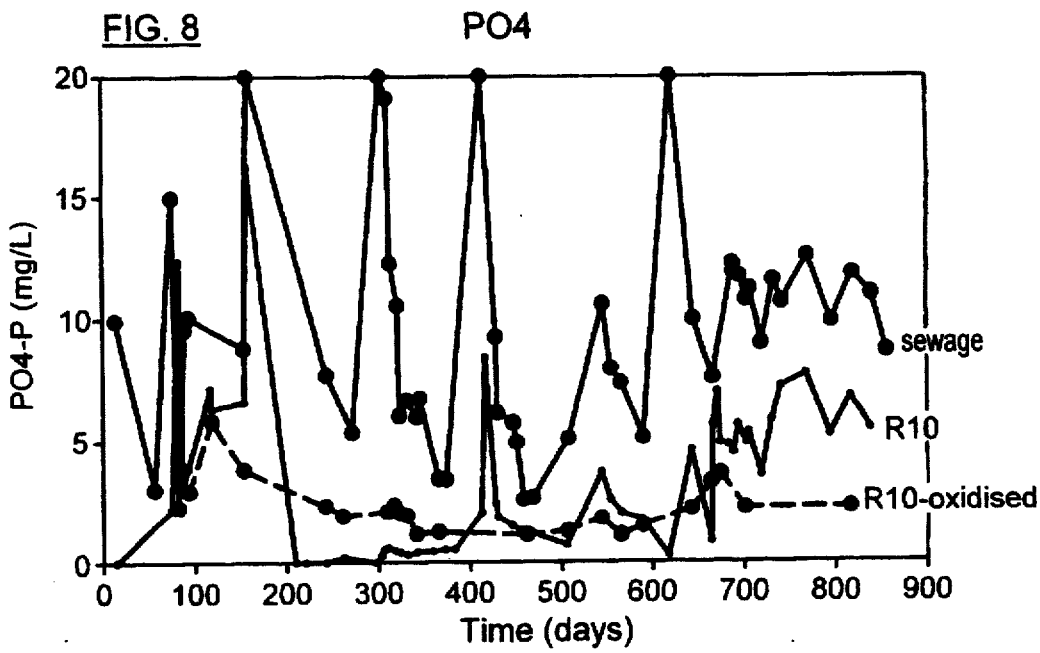

Referring now to FIG. 8, another important feature of the present invention is illustrated. Ions are implanted 86 through the gate electrodes 62 to code the mask ROM devices. The ion implantation 86 is performed in a selective fashion. A masking layer 82 of photoresist is used to block or permit passage of the ions into selected devices. The masking photoresist 82 is patterned, for example, using a photolithographic process that opens the photoresist 82 where selective mask ROM cells are to be implanted.

The implantation of the ions 86 through the gate electrode layer 62 forms an implanted region 90 under the gate electrode 62 in the channel region of the transistor. The presence of the implanted region alters the $V_t$ of the transistor to the desired value for the code. For example, for N-code, phosphorous ions may be implanted at an energy of between 160 KeV and 180 KeV and a dosage of between about $1 \times 10^{13}$ atoms/cm$^2$ and $5 \times 10^{13}$ atoms/cm$^2$. For P-code, boron ions may be implanted at an energy of between about 100 KeV and 140 KeV and a dosage of between about $8 \times 10^{13}$ atoms/cm$^2$ and $2 \times 10^{14}$ atoms/cm$^2$.

The presence of the buffer layer 78 overlying the source and drain junctions 70 prevents ions from implanting into the semiconductor substrate 50 in the junctions and under the bird's beak area of the field oxide region 54. If ions were to implant in the bird's beak area, this would cause junction leakage and result in bit-line to bit-line leakage.

Figure 9:
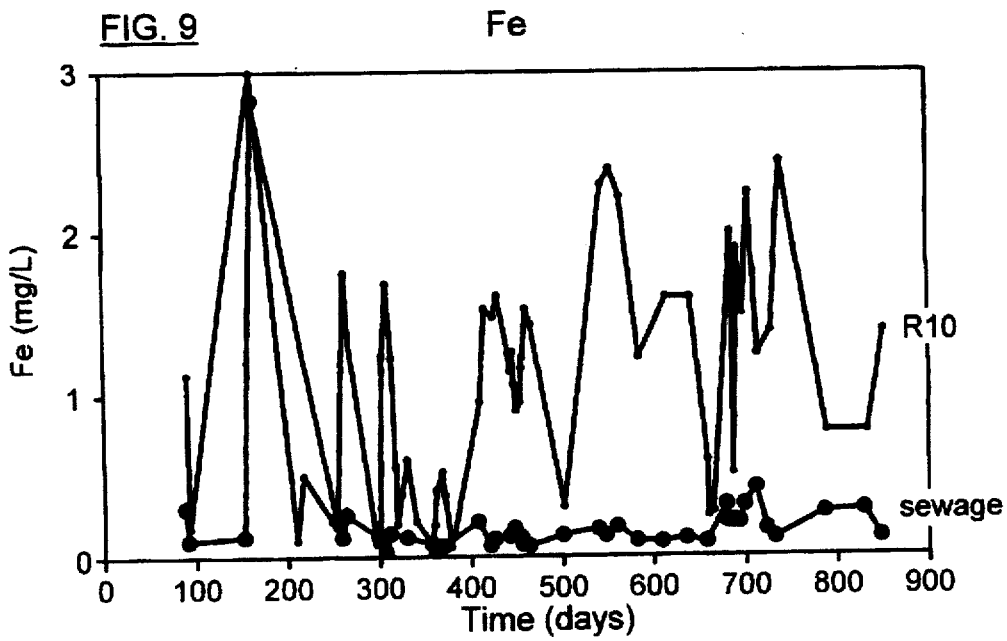

Referring now to FIG. 9, the buffer layer 78 is removed. A dielectric layer 94 is deposited conventionally to insulate the mask ROM device. After patterning contact openings, a metal layer 98 is deposited overlying the dielectric layer 94. The metal layer 98 is patterned to form desired connectivity and the mask ROM device is completed in the manufacture of the integrated circuit device.

Experimental data confirms the viability and effectiveness of the novel approach of the present invention for forming mask ROM devices. The prior art mask ROM process illustrated in FIGS. 1 and 2 performs the coding implant after the formation of the sacrificial oxide layer but before the formation of the gate electrodes and the source and drain junctions. This prior art process produces an exemplary yield of about 85%. By comparison, the preferred embodiment of the present invention produces a yield of about 74%. It is believed that fine-tuning the process of the invention will allow further yield improvement. In addition, the preferred embodiment of the present invention is found to postpones the critical coding implantation step ten days further into the processing cycle. This delay in coding allows the manufacturer to process material up to the coding operation and hold this material until it is needed by a customer with a final masking code design. The customer will then receive finished product ten days sooner. The manufacturer will also tend to scrap less product due to last minute code changes.

Finally, experimental material has been processed excluding the critical buffer layer. That is, the process of the present invention was performed without protecting the source and drain junctions during the coding implantation. The experimental yield of 0% confirms the need and effectiveness of the buffer layer. The high energy required to implant the channel area through the gate electrode causes a great deal of residual and undesirable implantation. The bit line to bit line leakage is too great to allow for any device yield.

As shown in the preferred embodiments, the present invention provides a very manufacturable process for forming mask ROM devices in an integrated circuit device. The application of the present invention in the preferred embodiments forms the mask ROM devices up to and including the gate electrodes and the source and drain junctions. The coding implantation is then selectively performed with a buffer layer overlying the source and drain junction to prevent unwanted ion implantation.

While the invention has been particularly shown and described with reference to the preferred embodiments thereof, it will be understood by those skilled in the art that various changes in form and details may be made without departing from the spirit and scope of the invention.

What is claimed is:

1. A method to form a mask read-only memory (ROM) device in the manufacture of an integrated circuit device comprising:

providing a semiconductor substrate wherein field oxide areas are defined and wherein a gate oxide layer overlies said semiconductor substrate;

depositing a gate electrode layer overlying said gate oxide layer;

patterning said gate electrode layer and said gate oxide layer to form gate electrodes;

thereafter implanting ions into said semiconductor substrate to thereby form source and drain junctions;

thereafter depositing a buffer layer overlying said gate electrodes, said source and drain junctions, and said field oxide areas;

etching down said buffer layer to expose said gate electrodes while leaving a protective thickness of said buffer layer overlying said source and drain junctions; and thereafter implanting ions through said gate electrodes into said semiconductor substrate to thereby selectively code said mask ROM devices and to complete said mask ROM devices in the manufacture of said semiconductor device, wherein a coding mask controls said implanting ions to selectively code and wherein said buffer layer prevents said ions from penetrating into said source and drain areas.

2. The method according to claim 1 wherein said gate electrode layer comprises polysilicon.

3. The method according to claim 1 wherein said gate electrode layer is deposited to a thickness of between about 2,500 Angstroms and 3,500 Angstroms.

4. The method according to claim 1 wherein said buffer layer comprises one of the group of: bottom anti-reflective coating (BARC) and spin-on glass (SOG).

5. The method according to claim 1 wherein said buffer layer is deposited to a thickness of between about 1,000 Angstroms and 2,500 Angstroms.

6. The method according to claim 1 wherein said protective thickness of buffer layer after said step of etching down said buffer layer is between about 700 Angstroms and 1,500 Angstroms.

7. The method according to claim 1 wherein said step of implanting ions through said gate electrodes comprises phosphorous ions implanted at an energy of between about 160 KeV and 180 KeV and a dose of between about $1 \times 10^{13}$ ions/cm$^2$ and $5 \times 10^{13}$ ions/cm$^2$.

8. The method according to claim 1 wherein said step of implanting ions through said gate electrodes comprises boron ions implanted at an energy of between about 100 KeV and 140 KeV and a dose of between about $8 \times 10^{13}$ ions/cm$^2$ and $2 \times 10^{14}$ ions/cm$^2$.

9. The method according to claim 1 further comprising:

implanting ions into said semiconductor substrate to thereby form lightly doped drain junctions after said step of patterning said gate electrode layer and said gate oxide layer to form said gate electrodes; and thereafter forming sidewall spacers on said gate electrodes before said step of implanting ions to thereby form said source and drain junctions.

10. A method to form a mask read-only memory (ROM) device in the manufacture of an integrated circuit device comprising:

providing a semiconductor substrate wherein field oxide areas are defined and wherein a gate oxide layer overlies said semiconductor substrate;

depositing a gate electrode layer overlying said gate oxide layer;

patterning said gate electrode layer and said gate oxide layer to form gate electrodes;

thereafter implanting ions into said semiconductor substrate to thereby form lightly doped drain junctions;

thereafter forming sidewall spacers on said gate electrodes;

thereafter implanting ions into said semiconductor substrate to thereby form source and drain junctions;

thereafter depositing a buffer layer overlying said gate electrodes, said source and drain junctions, and said field oxide areas;

etching down said buffer layer to expose said gate electrodes while leaving a protective thickness of said buffer layer overlying said source and drain junctions; and thereafter implanting ions through said gate electrodes into said semiconductor substrate to thereby selectively code said mask ROM devices and to complete said mask ROM devices in the manufacture of said semiconductor device, wherein a coding mask controls said implanting ions to selectively code and wherein said buffer layer prevents said ions from penetrating into said source and drain areas.

11. The method according to claim 10 wherein said gate electrode layer comprises polysilicon.

12. The method according to claim 10 wherein said gate electrode layer is deposited to a thickness of between about 2,500 Angstroms and 3,500 Angstroms.

13. The method according to claim 10 wherein said buffer layer comprises one of the group of: bottom anti-reflective coating (BARC) and spin-on glass (SOG).

14. The method according to claim 10 wherein said buffer layer is deposited to a thickness of between about 700 Angstroms and 1,500 Angstroms.

15. The method according to claim 10 wherein said protective thickness of buffer layer after said step of etching down said buffer layer is between about 700 Angstroms and 1,500 Angstroms.

16. The method according to claim 10 wherein said step of implanting ions through said gate electrodes comprises phosphorous ions implanted at an energy of between about 160 KeV and 180 KeV and a dose of between about $1 \times 10^{13}$ ions/cm$^2$ and $5 \times 10^{13}$ ions/cm$^2$.

17. The method according to claim 10 wherein said step of implanting ions through said gate electrodes comprises boron ions implanted at an energy of between about 100 KeV and 140 KeV and a dose of between about $8 \times 10^{13}$ ions/cm$^2$ and $2 \times 10^{14}$ ions/cm$^2$.

18. A method to form a mask read-only memory (ROM) device in the manufacture of an integrated circuit device comprising:

providing a semiconductor substrate wherein field oxide areas are defined and wherein a gate oxide layer overlies said semiconductor substrate;

depositing a polysilicon layer overlying said gate oxide layer;

patterning said polysilicon layer and said gate oxide layer to form gate electrodes; thereafter implanting ions into said semiconductor substrate to thereby form lightly doped drain junctions;

thereafter forming sidewall spacers on said gate electrodes;

thereafter implanting ions into said semiconductor substrate to thereby form source and drain junctions;

thereafter depositing a buffer layer overlying said gate electrodes, said source and drain junctions, and said field oxide areas wherein said buffer layer comprises a bottom anti-reflective coating (BARC);

etching down said buffer layer to expose said gate electrodes while leaving a protective thickness of said buffer layer overlying said source and drain junctions; and thereafter implanting ions through said gate electrodes into said semiconductor substrate to thereby selectively code said mask ROM devices and to complete said mask ROM devices in the manufacture of said semiconductor device, wherein a coding mask controls said implanting ions to selectively code and wherein said buffer layer prevents said ions from penetrating into said source and drain areas.

19. The method according to claim 18 wherein said polysilicon layer is deposited to a thickness of between about 2,500 Angstroms and 3,500 Angstroms.

20. The method according to claim 18 wherein said protective thickness of buffer layer after said step of etching down said buffer layer is between about 700 Angstroms and 1,500 Angstroms.

* * * * *

UNITED STATES PATENT AND TRADEMARK OFFICE
CERTIFICATE OF CORRECTION

PATENT NO. : 6,214,229 B1
DATED : April 10, 2001
INVENTOR(S) : William Dean Robertson It is certified that error appears in the above-identified patent and that said Letters Patent is hereby corrected as shown below:

See Abstract.
See Specification.
See Claims.

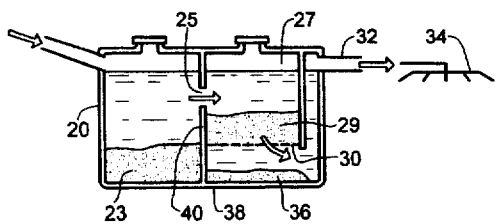

Signed and Sealed this

Fifth Day of February, 2002

Attest:

Attesting Officer

JAMES E. ROGAN
Director of the United States Patent and Trademark Office

(12) United States Patent
Robertson

(10) Patent No.: US 6,214,229 B1
(45) Date of Patent: Apr. 10, 2001

(54) TREATMENT SYSTEM FOR REMOVING PHOSPHORUS

(75) Inventor: William Dean Robertson, Waterloo (CA)

(73) Assignee: University of Waterloo, Waterloo (CA)

(*) Notice: Subject to any disclaimer, the term of this patent is extended or adjusted under 35 U.S.C. 154(b) by 0 days.

(21) Appl. No.: 09/190,415

(22) Filed: Nov. 3, 1998

(30) Foreign Application Priority Data

Nov. 5, 1997 (GB) .................................. 9723347

(51) Int. Cl.$^7$ ........................................ C02F 1/58
(52) U.S. Cl. ............... 210/605; 210/617; 210/630; 210/631; 210/717; 210/719; 210/721; 210/747; 210/906
(58) Field of Search ........................ 210/605, 617, 210/630, 631, 667, 717, 719, 721, 724, 747, 906

(56) References Cited

U.S. PATENT DOCUMENTS

| | | | |
|---|---|---|---|
| 4,029,575 | * 6/1977 | Bykowski et al. | 210/16 |
| 4,167,479 | * 9/1979 | Besik | 210/7 |
| 4,184,947 | * 1/1980 | Demisch | 210/18 |
| 5,271,848 | * 12/1993 | Smith et al. | 210/702 |
| 5,318,699 | * 6/1994 | Robertson et al. | 210/151 |
| 5,620,893 | * 4/1997 | Hogen et al. | 435/262 |
| 5,707,513 | * 1/1998 | Jowett et al. | 210/150 |
| 5,783,088 | * 7/1998 | Amonette et al. | 210/679 |
| 5,876,606 | * 3/1999 | Blowes et al. | 210/679 |
| 5,980,739 | * 11/1999 | Jowett et al. | 210/151 |

* cited by examiner

*Primary Examiner*—Peter A. Hruskoci
(74) *Attorney, Agent, or Firm*—Anthony Asquith & Co.

(57) ABSTRACT

Sewage water containing phosphate is passed through an anaerobic treatment chamber containing reductive-iron-dissolution (RID) material, such as ferric oxyhydroxide solids. The RID material releases ferrous ions into solution, which combine with the phosphate to produce ferrous-phosphate minerals, such as vivianite, which precipitate in the anaerobic chamber. Also, iron and phosphate remaining in the water can precipitate as ferric-phosphate minerals such as strengite, when the water is later aerated.

20 Claims, 4 Drawing Sheets

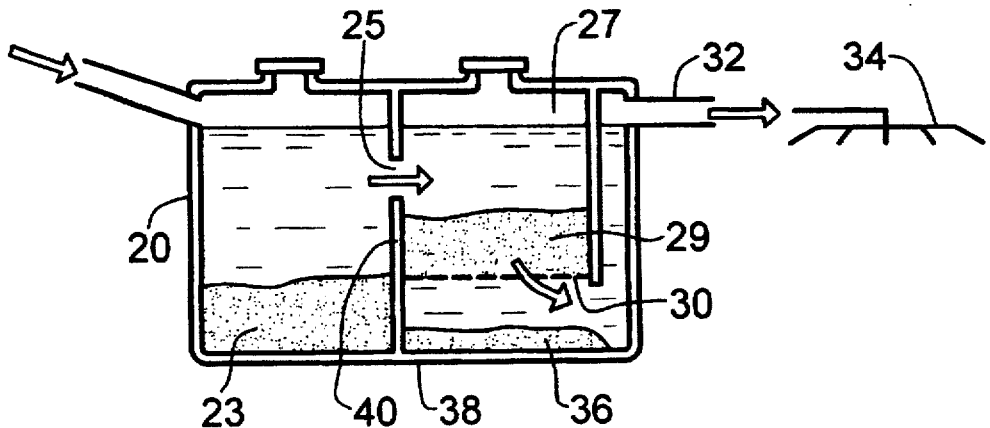

Comparison of PO4 and Fe concentrations in filtered raw sewage dosed to a laboratory sediment column before (sewage) and after (RID) entering an anaerobic container with RID media and after RID effluent is oxidised.

TREATMENT SYSTEM FOR REMOVING PHOSPHORUS

This invention relates to the remediation of water contaminated with phosphorus.

BACKGROUND TO THE INVENTION

In many ponds, lakes, and other bodies of water, the nutrient balance is such that phosphorus is the nutrient that limits the growth of algae. An increase in the amount of phosphorus in the water can cause an excess of algae. This can deplete the oxygen and the other nutrients in the water, to the detriment of fish and other life forms. It is therefore important to prevent excess phosphorus from entering the body of water.

Often, excess phosphorus comes from sewage. Sometimes, the excess phosphorus is in the effluent from small-scale domestic septic tank systems, and in some cases the factor that limits how many dwellings can be located in an area near a lake is the fact that any further dwellings will cause an unacceptable increase in the amount of phosphorus entering the lake.

The traditional way of limiting phosphorus has been to limit the number of dwellings. Conventional sewage treatment, especially that carried out in a traditional domestic septic tank, has not been aimed at removing, and does not remove, the phosphorus to any substantive degree.

The invention is aimed at treating sewage water, to attenuate the phosphorus content thereof. Another aim is to provide a phosphorus treatment system which operates on the water as the water is passing through the septic-tank or other sewage treatment system, whereby the costs attributable solely to the phosphorus treatment system are minimised. Another aim is to provide a treatment system which requires nothing, or very, little, by way of on-going attention and maintenance, over long periods of use.

GENERAL FEATURES OF THE INVENTION

The invention lies in placing a body of RID material in the water to be treated, and keeping the water, and the RID material, under anaerobic conditions. Preferably, the anaerobic conditions are so strict that the Eh voltage of the water becomes very low, or negative.

For the purposes of this specification, RID material means Reductive Iron Dissolution material. That is to say, RID material is material that contains ferric iron, and the ferric iron therein is capable of undergoing a change in oxidation state, i.e is capable of being reduced, to ferrous iron, under conditions of anaerobicity, i.e conditions of low or negative Eh voltage.

As to pH, generally sewage water tends to of neutral, or near-neutral, pH, under which conditions the newly-created ferrous ions are much more soluble than the ferric ions, and readily pass into solution in the water.

The phosphorus-attenuation systems as described herein make use of the fact that iron in the ferric oxidation state $Fe^{3+}$ is very insoluble at neutral pH values, but in its ferrous oxidation state $Fe^{2+}$ is much more soluble. The invention recognises that in anaerobic (low Eh) waters, ferric iron is unstable and can be solubilized by reduction to $Fe^{2+}$. The dissolved Fe content in anaerobic waters can thus rise to tens of milligrams Fe per litre of water (and considerably more than that in some cases).

The presence of large amounts of dissolved iron in the water leads to phosphate precipitation by two mechanisms. First, in the anaerobic environments, when phosphate is present, increased iron levels lead to the formation of ferrous-phosphate minerals, such as vivianite $Fe_3(PO_4)_2.8H_2O$ which is insoluble enough to precipitate. Second, when the effluent is subsequently oxidised, any still-remaining dissolved ferrous ions tend to start to oxidise back to ferric ions, but because of the still-dissolved phosphate, the ferric ions now tend to form ferric-phosphate compounds, such as strengite $FePO_4.2H_2O$ which again is insoluble enough to precipitate.

Thus, the dissolved ferrous iron provides two mechanisms for drawing the phosphate ions out of solution, and causing them to precipitate.

In fact, a third mechanism can be present also. Oxidation of the ferrous ions back to ferric will result in precipitation of some ferric hydroxide or oxyhyroxide, besides the strengite and other ferric-phosphate minerals. Ferric oxyhydroxide serves as an excellent medium for adsorbing phosphate ions out of solution.

When all three mechanisms are present, the phosphate is removed (a) by precipitation in the anaerobic area as vivianite, (b) by precipitation in the aerobic area as strengite, and (c) by adsorption. All three mechanisms, however, require first that insoluble ferric iron be converted to soluble ferrous iron, which requires a low Eh; and it is recognised that raw sewage, held under anaerobic conditions, provides an excellent medium for promoting the reductive dissolution of ferric iron.

The RID material should be rich in ferric iron. Ferric hydroxide $Fe(OH)_3$ or oxy-hydroxide FeOOH compounds are suitable. (Ferric oxide, e.g hematite $Fe_2O_3$, would be unsuitable, because its mineral structure makes hematite less susceptible to reductive dissolution.

The RID material that is to be placed in the anaerobic conditions, i.e the material that contains the ferric iron, need only contain a little iron, as an overall percentage. The minimum effective iron content, for the purposes of the invention, may be regarded as being about 1 milli-gram of iron per gram of aggregate material (i.e 0.1%/wt). The iron content referred to here is the content of ferric iron that can be reduced to ferrous iron (which is sometimes called the "acid-extractable" iron). The preferred ferric iron content in the RID material is in the region of 0.3 %/wt to 5 %/wt.

As to its physical or mechanical character, the RID material should be physically capable of releasing its ferrous ions into the water. The RID material should be porous, and permeable to the passage of a flow of water through the material. The RID material may include a matrix of sand, which is chemically inert, which supplies the grain size for maintaining permeability. The RID material preferably may be supplied as sand-sized grains, the grains being coated with powder-sized particles of the ferric substances.

Ferric hydroxides and oxyhydroxides are available quite readily in many places, in the soil-B horizon; that is to say, in the mineral-enhanced area underneath the top-soil. Suitable ferric hydroxide compounds have the characteristic red-orange-brown colour associated with a high ferric content.

If the ferric content of the locally-available material is inadequate, extra ferric can be provided in the form of e.g $Fe(OH)_3$ (ferri-hydrite) or FeOOH (geothite). These minerals are readily available in powder form (they are used for making pigmentations), and can be used with bulk filler such as local sand.

Providing RID material with a ferric content of more than about 5 %wt would not be suitable, because the ferric hydroxide and oxyhydroxide materials minerals are generally of a fine-grained nature, and the greater percentage would, or might, diminish permeability too much.

The degree to which the phosphorus contamination in the water is attenuated depends on the amount of iron that is solubilized. In a typical real case, the residence time needed for an effective amount of ferrous ions to enter the water may be regarded as being in the order of a day or two; that is to say, about the same residence time as the water in a well-engineered small system spends in the anaerobic septic tank.

Typically, a system that handles a through-flow of 1000 litres/day of sewage has a septic tank volume of about 3500 litres. In a case where the presence of phosphorus is troublesome enough to warrant being addressed by the system as described herein, the concentration of phosphorus in the seater might be, for example, 10 mg-P per litre of the water. Such a system would need to be supplied with fresh ferrous iron entering solution at the rate of about 5 grams Fe per day. Given that the body of RID material contains, for example, about 2%wt of ferric iron, a mass of RID material of about 1800 kilograms (which would be about 1 cubic metre of material) can be expected to go on releasing ferrous iron into solution at that sort of rate for many months, and possible for many years.

It is recognised that providing such an amount of RID material can be done economically, and that amount of material can be readily accommodated in a sewage treatment system without resorting to great expense, over and above what is needed in any event for the main task of the conventional system, i.e the remediation of the ammonium and organic constituents in the water.

It is recognised that it is economical to keep this quantity of ferric iron on hand, and available for the slow release of ferrous ions, at the required rate such that the amount of Fe taken into each charge of water that goes through the system can be expected to contain in the range of 1–20 mg-Fe per litre of water.

Once the ferrous ions have entered the water, the water should still be kept under strict anaerobic conditions. The reaction of the ferrous ions with the phosphate ions takes, again, about a day or so, in order for a majority of the phosphate to precipitate out as vivianite and the other ferrous-phosphate precipitants.

It may be noted that building up the required concentration of ferrous ions in the water does not take place immediately, but takes several hours, during which time the water must remain in contact with the RID material, and anaerobic. Also, the time taken for the required degree of precipitation of vivianite to take place, likewise is several hours (during which time, again, the conditions must remain strictly anaerobic). It is recognised that because the two processes are sequentially separated in time, they can be physically separated. This is advantageous, because it means the designer can arrange for the precipitation of the vivianite to take place after the water has left the RID material. Therefore, the designer can arrange that the main bulk of the precipitated vivianite accumulates outside the RID material. Thus the RID material can remain unclogged over long periods. (This aspect may be contrasted with systems in which the phosphate is removed out of solution by adsorption; of course in that case the adsorbed solid phosphate cannot avoid clogging the permeability of the treatment material.)

Because the dissolution reaction consumes iron from the RID material, replenishment of the material will be required periodically. The designer should preferably design for easy replenishment of the RID material, and it is sensible also to provide for removal of the vivianite at the same time. Of course, the prudent designer will seek to make the intervals of replenishment of the RID material coincide with the normal periodic maintenance of the septic tank.

Although the treatment configurations discussed here pertain to sewage treatment in septic systems, the system can also be used in conjunction with conventional wastewater treatment plants and with other wastewaters containing phosphorus.

THE INVENTION IN RELATION TO THE PRIOR ART

Iron has been used for phosphate treatment in conventional sewage treatment processes. The iron is added as iron salts, e.g ferrous chloride, or ferric chloride, which are much more soluble than the ferric oxyhydroxide compounds present in the RID material. These salts are effective in causing the precipitation of phosphate; but because they dissolve quickly, the salts must be added continually to the wastewater stream, manually or by mechanical means, so that continual maintenance is required. Systems that require such constant attention can be viable in municipal sewage systems, but are contra-indicated for domestic systems, where any departure from the minimum amount of attention needed by the traditional septic tank system would not find favour.

Because RID material solubilizes iron more slowly and only under anaerobic conditions, a large mass of RID material can be provided, and this large mass can be left to release ferrous ions into the water slowly, and over long periods of time, without attention or maintenance. These characteristics are attractive for smaller treatment systems.

Porous media material with ferric oxyhydroxide compounds have been suggested previously for treatment of phosphate from sewage, but by a distinctly different process, i.e absorption. Patent publications US-4,184,947 (Demisch, Jan. 2, 1980) and CA-2,190,033 (Blowes, May 11, 1997) show examples of sorption processes. At normal pH ranges, ferric oxide minerals have surfaces that are positively charged, and are thus capable of adsorbing anions such as phosphate. Such sorption reactions do not involve an increase in dissolved iron concentrations. The RID treatment process is distinct in that it requires that the RID material be placed in the water under such anaerobic conditions, and for such residence time, that ferric iron reduces to ferrous iron, whereby the concentration of iron dissolved in the water substantially increases. The increase in iron in the water is caused not by the dissolution of soluble iron salts, as was done in sewage works, but by providing anaerobic (i.e low Eh) conditions in which ferric iron solids can undergo a change in oxidation state, from $Fe^{3+}$ to $Fe^{2+}$.

In conventional sewage treatment, phosphorus levels have been controlled by addition of soluble metal salts (ferrous chloride, ferric chloride, alum, lime) which promote the precipitation of insoluble (that is to say, sparingly soluble) metal-phosphate mineral phases. Treatment requires continual addition of reagents however, so that the maintenance requirements generally make such treatment methods impractical for use with smaller domestic sewage treatment systems such as septic systems.

Previously suggested phosphate treatment methods for use with small septic systems have focussed on adsorption, using porous media material with enhanced capacity to absorb phosphate. At normal pH ranges, many metal hydroxide minerals such as ferrihydrite $Fe(OH)_3$ have a positive surface charge and thus have a strong capacity to absorb anions such as phosphate $PO_4^{3-}$.

DETAILED DESCRIPTION OF PREFERRED EMBODIMENTS

Figure 1:
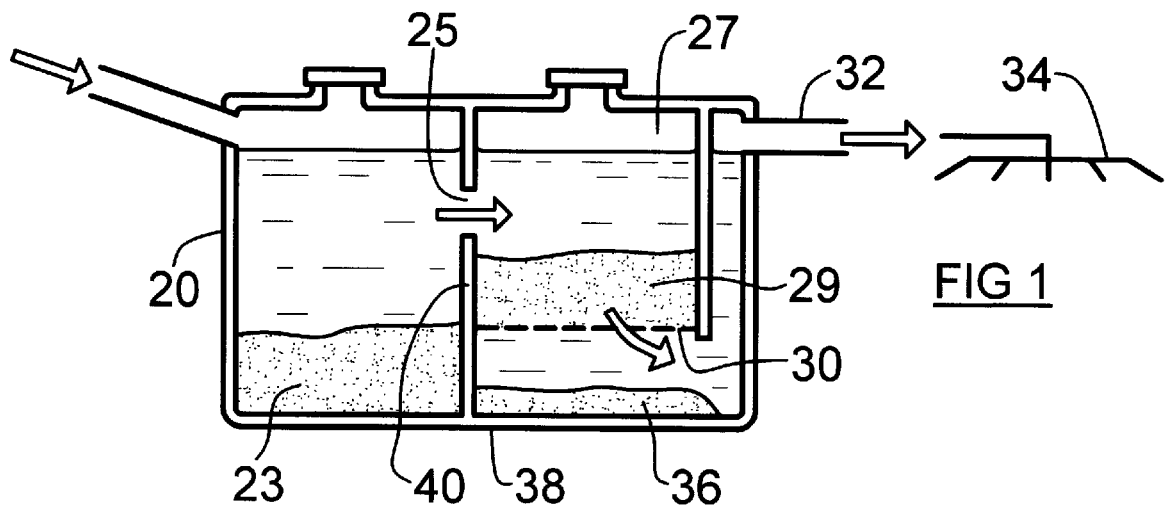
FIGS. 1 and 2 schematically illustrate in cross-section a partially completed prior art integrated circuit device.
Figure 2:
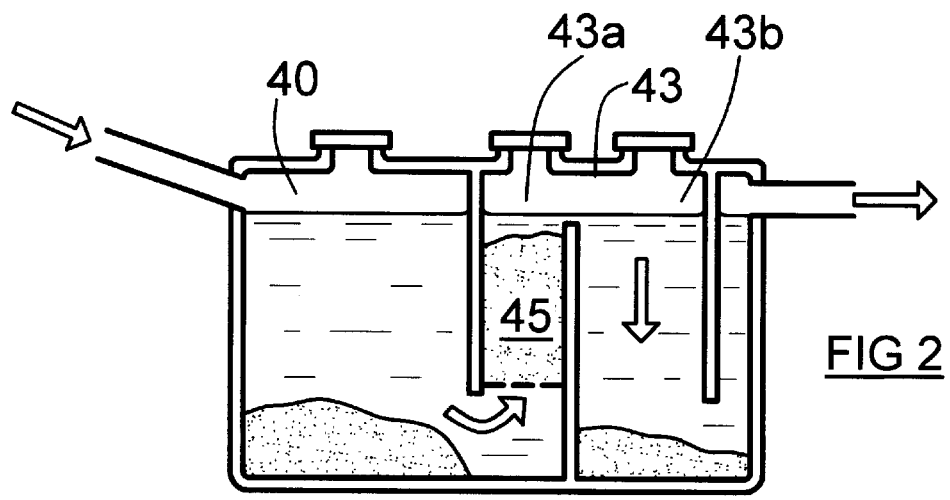

By way of further explanation of the invention, exemplary embodiments of the invention will now be described with reference to the accompanying drawings, in which:

FIG. 1 is a cross-sectional view of a water treatment system for carrying out treatment that embodies the invention;

FIG. 2 is a corresponding view of another system;

FIG. 3 is a corresponding view of another system;

FIG. 4 is a corresponding view of another system;

FIG. 5 is a corresponding view of another system;

FIG. 6 is a corresponding view of another system;

FIG. 7 is a corresponding view of another system;

FIG. 8 is a graph showing attenuation of phosphate from the water;

FIG. 9 is a graph showing presence of iron in the water.

The systems shown in the accompanying drawings and described below are examples which embody the invention. It should be noted that the scope of the invention is defined by the accompanying claims, and not necessarily by specific features of exemplary embodiments.

FIG. 1 shows raw sewage (from e.g a domestic house) being fed to a primary tank 20. The primary tank may be regarded as equivalent to a conventional septic tank. As in a septic tank, the water in the primary tank is maintained under anaerobic conditions. In the primary tank, the usual digestion of organic materials in the sewage takes place, and inert solids in the water settle to the floor of the tank. Also, if organic phosphate is present in the sewage, much of that is transformed, as usual, into inorganic phosphate in the primary tank. (It is the inorganic phosphate which is attenuated by the remediation treatments as described herein.)

Sludge 23 collects on the floor of the primary tank 20. The partially treated water from the primary tank leaves via pipe 25. The water now enters a secondary treatment chamber 27. The water in the secondary treatment chamber also is maintained under strict anaerobic conditions. In this secondary treatment chamber is provided a body 29 of RID material, which rests on a support screen 30. The body 29 of RID material is permeable, and the water passes through the body. The water emerges from the secondary treatment chamber 27 via pipe 32. From there, the water passes to a tile-bed or soakaway 34. Here, the water is exposed to the air, and the usual oxidation reactions commence.

In the anaerobic conditions inside the secondary treatment chamber 27, low redox-voltage (i.e low Eh-voltage) conditions prevail. The ferric RID material 29 becomes unstable, and the ferrous (reduced) form becomes the stable state. Ferrous ions have a much greater solubility, and the ferrous ions pass into solution.

The dissolved ferrous ions react with the dissolved phosphate ions in the water, under the maintained-anaerobic conditions, to form ferrous-phosphate mineral substances, such as vivianite $Fe_3(PO_4)_2.8H_2O$ which is insoluble, and which precipitates. The solid vivianite collects as a sludge 36 in the anaerobic secondary treatment chamber 27.

Generally, upon leaving the chamber 27, there will still be some ferrous ions in solution in the water, and there will still be some phosphate ions in solution in the water, when the water is passed through pipe 32 to the aerobic treatment zone 34. stage. Now, the Eh-voltage goes up, and the ferrous ions tend to oxidise, i.e to revert to the ferric state. The ferric state being much less soluble, as mentioned, precipitation occurs. The substance that precipitates, however, need not be the ferric hydroxide and oxyhydroxide (from whence the iron came) but rather, the presence of the phosphate ions leads to the formation of combined ferric-phosphate minerals, such as strengite $FePO_4.2H_2O$ Strengite also is insoluble, and precipitates. Thus, more of the phosphate is taken out of the water as the ferric ions come out of solution.

Some ferric oxyhydroxide, and other ferric substances, do precipitate, however, in the aerobic treatment zone 34. And in fact, these precipitates can act to remove even more phosphate; this is because the newly-formed ferric oxyhydroxide is an excellent adsorbing medium, and is effective to sorb even more of the phosphate out of the water.

Tests have shown that the following level of performance is possible, and expected, in a well-engineered system. Of the total inorganic phosphorus burden (i.e the phosphate-P burden) in the water entering the anaerobic secondary treatment chamber 27, 70–80% of the phosphate-P can be expected to be removed in the secondary treatment chamber, by precipitation as vivianite and the other ferrous-phosphate minerals. And a total of around 90–98% of the phosphate-P burden can be expected to have been removed from the water leaving the aerobic treatment zone, following the further precipitation of strengite and the other ferric-phosphate minerals, and as a result of sorption of the phosphate onto the newly-precipitated ferric oxyhydroxide.

As far as the physical characteristics of the system shown in FIG. 1 are concerned, the primary tank 20 and secondary chamber 27 can be formed by providing a single tank structure 38, and placing a baffle 40 to separate the tank 20 from the chamber 27. The sludge 23 that collects on the floor of the primary tank is normal septic-tank sludge, which has to be removed every two or three years, in a well-designed system. At the same time as that traditional septic-system maintenance work is being done, the RID material 29 can be replaced, and the vivianite sludge 36 can be removed. That is to say, the replenishment of the RID material, and the removal of the phosphorus-laden precipitates, can be timed more or less to coincide with normal maintenance of the septic system.

The amount of accumulation of strengite and other ferric minerals in the aerobic treatment zone is likely to be so small as to be not worth removing, during the life of the system. (It may be noted that it would be very difficult to extract any precipitated material from a soakaway.)

The RID treatment system, engineered in this way, is simple and inexpensive, and the maintenance work required is very much in line with the services already, provided by pump-out contractors and septage hauliers, both as to the nature of the work and as to timing.

FIG. 2 shows a slightly more elaborate set-up. Here, water from the anaerobic primary tank 40 is drawn upwards through the first portion 43a of the anaerobic secondary treatment chamber 43, in which is located the permeable body 45 of RID material. The water then passes into the second portion 43b of the treatment chamber, which is maintained anaerobic also. The water entering the second portion 43b contains a maximum of dissolved ferrous ions, having just passed through the body 45, and there is ample opportunity for the reaction of the ferrous ions with the phosphate ions to take place, and to be maximised, in the second portion 43b of the treatment chamber. The vivianite sediment collects on the bottom of the second portion 43b, and it can be removed from there just as can the sludge from the bottom of the primary tank 40.

Of course, the main purpose of a septic system is to process the ammonium in the sewage, and that function should not be compromised by the phosphate remediation. The designer of the phosphate remediation should note that it would be disadvantageous if the permeable body of RID material had to cope with such solids as may be present in the sewage, and so the designer should take care to place the body of RID material in a place where the water entering the body is substantially clear of solids. But that is not too difficult to engineer, as shown, and it may be noted that the iron-phosphate reactions can then proceed simultaneously, i.e in the same chambers, with the ammonium and other anaerobic sewage-processing reactions, so that the total volume of the anaerobic components of the system are hardly any greater than in a conventional septic system. Similarly, the capacity of the aerobic components need hardly be increased. It is the common practice to over-specify a septic system (mainly because of the large expense if the capacity had to be increased later), and the extra capacity needed by the phosphate system can normally be accommodated within that margin.

FIG. 3 shows an RID phosphorus-treatment system that is installed as a separate unit between a traditional septic tank 50 and a traditional tile-bed soakaway 52, both of which are left untouched. The anaerobic treatment chamber 54 (of concrete, plastic, or metal) contains a body 56 of RID material. The water from the septic tank 50 enters the chamber 54, still under anaerobic conditions. The vivianite precipitates into the body 56, and the designer should see to it that the body will remain permeable and unclogged for a suitable number of months.

FIG. 4 shows another version of a separate phosphorus-treatment unit that fits between a traditional septic tank and tile-bed soakaway. Here, the unit 60 houses the anaerobic treatment chamber 63, containing the body of RID material, as well as an aerobic cell 65. Oxidation of the ferrous ions to ferric, and the precipitation of ferric-phosphates such as strengite, are processes that take place, or get started, in the aerobic cell 65. It is an advantage if the tile bed soakaway (which comes later) is not subjected to the strengite precipitation, i.e if at least some of the strengite (and the ferric hydroxides) can be removed before the water reaches the tile bed.

The main function of the aerobic tile bed is to convert the (dissolved) ammonium into (dissolved) nitrate, and if some conversion of ammonium to nitrate takes place in the aerobic cell 65, so much the better. But it is advantageous for the main function of the tile bed soakaway if the soakaway is not troubled by the solids that have precipitated in the cell 65.

In the case of a pre-existing septic tank system, in which it is desired to achieve some phosphorus attenuation, with a minimum of expenses, the system shown in FIG. 5 might be considered.

In FIG. 5, the RID material is in the form of briquettes 70, which are suspended in the pre-existing septic tank 72. Now, the water does not flow through the RID material, in the sense as previously described, but rather the ferrous ions, upon entering solution, diffuse from the briquettes out into the water in the septic tank. This arrangement can therefore be expected to be inferior to the systems where the water flows actually through the permeable body of RID material. Also, sewage solids are present in the septic tank 72, which can affect the RID material.

FIG. 6 shows another version. In the previous designs, it was convenient to maintain continuity between the anaerobic water in the phosphorus treatment zone with the anaerobic water in the septic tank, but such continuity is not essential. In fact, the water can be allowed to become aerated after passing from the septic tank, and the water can still be rendered suitable for phosphorus treatment using the processes described herein, by making the water once more anaerobic. In FIG. 6, the anaerobic treatment chamber is located underneath the aerobic tile bed.

In many cases, it will be convenient to provide the anaerobic treatment chamber below the water table, because that is where it is easier to maintain anaerobic conditions. FIG. 6 shows, however, that an anaerobic chamber 80 can be provided above the water table 83. A liner 85 of plastic or other impervious material defines the bottom of the chamber. The body 86 of RID material is placed on top of the liner, and the infiltration pipes 87 and gravel body 89 of the soakaway are placed on top of that, i.e above the RID material.

The RID material must remain anaerobic, and this can be achieved by ensuring the RID material cannot dry out. The grain size of the RID material can be selected such that the material remains tension-saturated for long periods of time, and the liner 85 creates a basin in which the water under treatment is retained. In FIG. 6, the precipitated vivianite collects in the RID material, which is not preferred, but this system might be applicable in some cases.

FIG. 7 shows another treatment system. As mentioned, preferably the water entering the RID media should not previously have been aerated, because aeration increases the residence time needed to bring the water down to near-zero or negative Eh-voltage. Preferably, therefore, the system is so arranged that the water being presented to the RID media is already in a thoroughly anaerobic condition. However, the attenuation of phosphorus using the RID treatment system can still be employed, even if the water to be treated has been previously aerated. But then, the required anaerobic conditions of the RID media must be engineered.

Pre-aeration of the water can be present as a result of, for example, mechanical aeration, or the use of unsaturated sand filters, peat systems, biofilters, or the like. To effect the RID process, the designer should provide a secondary anaerobic chamber 90, in which reducing-Eh conditions are re-established, in line following an aerobic treatment station 92. This can be done by adding a carbon source 94 or other electron donor source in the secondary chamber 90. Suitable electron-donor sources can include sawdust, compost, pyrite, or the like. The environment in the secondary chamber 90 should be such as to establish thoroughly anaerobic conditions in the chamber, i.e such that the Eh-voltage of the water can go negative, or almost so.

Thus, an organic carbon material such as sawdust or compost is useful for establishing conditions in which the Eh voltage will fall. The provision of organic carbon also has another benefit.

One result of aerobic pre-treatment is that ammonium in the water can already be oxidised (at least partially) to nitrate. It is known that passing nitrate-laden water through organic carbon material under anaerobic conditions can lead to denitrification of the dissolved nitrate. It is recognised that the carbon material 94 can be mixed with the RID media material, in the one anaerobic chamber. Now, the system has the advantage of potentially enabling the simultaneous treatment of the nitrate (by denitrification), and of the phosphate.

FIG. 8 is a graph showing the on-going remediation of phosphorus in laboratory tests. Phosphate-P is present in the incoming sewage at a burden varying between 5 and 20 milligrams-P per litre of water. Precipitation in the anaerobic chamber reduces the P by a first, large, proportion, and then the subsequent aerobic precipitation brings the P down to 2mg/L or less. FIG. 9 is a graph showing the amount of ferrous iron that is put into solution by the RID process. As shown, the ferrous content can be expected to be in the 1 or 2 mg/L range.

It is recognised that passing sewage water over RID material, under anaerobic conditions, can be expected to put ferrous ions into solution in domestic sewage water at the rate of 1 or 2 milligrams per litre, or more, and to continue doing so, without replenishment, and indeed without additional input or attention of any kind, over periods that can be measured in months or even years.

At that rate, dissolved phosphorus (in phosphate form) can be attenuated from a problematic 10 mg/L down to the much lower 2 mg/L, or less, as the sewage water passes through the kind of treatment phases it has to undergo in any event.

Replenishing the supply of RID material every two years or so is much more acceptable than tipping in a bag of soluble treatment salts every few days. The precipitated vivianite etc minerals might eventually clog up the treatment system, if left, but the system can be arranged so these minerals are collected in a place where they can be easily removed, and they can be carried away periodically—at the same time as the sludge from the septic tank, for example. Thus, as far as the user is concerned, although the RID phosphorus-attenuation system is not quite in the fit-it-and-forget-it category, the needs of a properly-engineered RID system are no more demanding than the needs of the properly-engineered conventional septic system into which it is incorporated.

When trouble occurs in conventional septic systems, it is usually because the system has been overloaded, perhaps with solids, or with ammonium; and of course, if an RID system has indeed been inadequately engineered, there will be similar problems with the RID system.

It is recognised, in the invention, that, given the amount of RID material that can conveniently and economically be provided for treating sewage water, and given the levels of phosphorus likely to be encountered in sewage water, the RID system can in fact provide an effective degree of attenuation of the phosphorus over long periods. If replenishment were needed every few days, the system would be of little practical use. If huge quantities of the RID material were needed for the treatment to be effective, or if the RID material was expensive to provide in the quantities needed, that would be no use either. The recognition is that the RID system can provide effective treatment performance, at an acceptably economical cost, both as to initial installation, and as to on-going maintenance.

As mentioned, a mineral is suitable to be considered as an RID material, in the invention, insofar as ferric material in the mineral reduces, under conditions of low Eh voltage (i.e less than +200 mV) and neutral pH, to a ferrous salt, and the ferrous salt is soluble under those Eh and pH conditions. It should also be noted that, when considering whether a mineral would be suitable, the rate at which the redox conversion takes place is important. In respect of some minerals, the redox conversion from ferric to ferrous, under the kind of Eh and pH conditions obtaining generally in septic tank effluent, would be very slow, the time scale of the changes being measured perhaps in thousands of years. For example, minerals such as hematite have such a very slow reduction rate, as to be of little use for generating soluble ferrous salts. Ferrous iron arising from minerals such as magnetite is not soluble under the reducing conditions, so they are not of much use either.

Preferably, the RID material is material in respect of which, under the reducing conditions, the ferrous iron enters solution at a rate of no less than 0.1 mg of Fe per day, per kg of the mineral. That is to say, if the production of ferrous material from the redox conversion is so slow that ferrous material enters solution at a rate of less than 0.1 mg/day per kg, the effect is so slight as to be not worthwhile. With some minerals, rates at which ferrous ions are produced, and enter solution, can be as high as 10 mg of Fe per day per kg, but it is noted that adequate remediation of phosphorus can be achieved with minerals that produce ferrous ions at lower rates than that. Indeed, too fast a rate would be less advantageous—the rate should be slow enough that the mineral will still be supplying ferrous ions after a period that is measured, preferably, in years, or at least in months. Redox reactions are slow enough, generally, that minerals that might be considered as RID material would be unlikely to produce too rapid a reductive conversion of ferric material.

In the systems as described herein, it does not matter if the ferrous ions are quick to dissolve; indeed it would not matter if the ferrous ions were to enter solution as soon as they were produced. The advantageous long-term performance of the mineral arises because the ferrous material is produced at a slow steady rate, not because the ferrous material in necessarily slow to dissolve.

It is recognised that a commercially worthwhile rate of production of soluble ferrous ions can be achieved by the use of certain ferric minerals, under the reducing conditions encountered in septic tank effluent. For the remediation of phosphorus to be long-term and effective, the production of soluble ferrous ions should not be so fast that the material is quickly used up (but of course, the rate of production should be substantial enough that the quantity of soluble material produced is worthwhile).

It is recognised that a suitable rate of production of soluble ferrous ions can be engineered in the manner as described herein. It is recognised that in trying to treat phosphorus simply by providing soluble ferrous salts, the designer will always face the great difficulty of slowing down the rate at which the ferrous material enters solution, such that there would still be some ferrous ions entering solution after a period of months or years. It is recognised that the highly-suitable rate that arises in the systems as described arises basically automatically, without the need for attention on the part of the owner of the system.

The Eh or redox voltage of the water in which the reactions take place should be less than about +200 mV. This figure does not represent a sudden cut-off point, above which no result is obtainable. The +200 mV limit identifies a commercially worthwhile rate; +300 mV would be the level above which reduction of ferric to ferrous generally would hardly be detectable. The more reducing the conditions, the greater the rate of production of ferrous ions. Reducing conditions of less than about −200 mV are unlikely to be encountered (or achieved) in septic tank effluent, and in any event such a low voltage might lead to too rapid a rate of reduction, whereby the mineral would be used up too quickly.

What is claimed is:

1. Procedure for attenuating dissolved phosphorus from water passing through a septic tank, wherein:

the septic tank is configured with an inlet conduit and an outlet conduit, and the procedure includes conveying the water therebetween;

the water flowing through the outlet conduit has, dissolved in it, an ammonium content;

the water flowing through the inlet conduit is contaminated by having, dissolved in it, a phosphorus content;

the septic tank is so arranged and operated, as to its configuration and as to the manner and rate at which the water passes therethrough, that water in the septic tank is under such strictly anaerobic reducing conditions that the Eh voltage of the water is less than 0.3 volts;

the procedure includes providing, in the septic tank, a body of treatment material;

the treatment material in the body includes solid grains of Reductive Iron Dissolution material, being RID-material, being material that consists of either ferric hydroxide or ferric oxy-hydroxide or both;

the conditions in the septic tank, as to the pH and the Eh of the water, are such that the ferric hydroxide or oxyhydroxide dissolves at a slow rate, and thereby releases ferrous ions into solution in the water, and the ferrous ions react with the phosphorus dissolved in the water, to produce solid ferrous-phosphate minerals, which precipitate;

the procedure includes so configuring the body of treatment material, in the septic tank, that the water, in the flowing towards the outlet conduit, has sufficient residence time that a major proportion of the dissolved phosphorus precipitates out as solid ferrous-phosphate minerals;

providing means for collecting the solid precipitate;

and conveying the water, having now given up the major proportion of its dissolved phosphorus, out of the outlet conduit of the septic tank.

2. Procedure of claim 1, wherein the conditions under which the RID material and the water are provided and maintained are such as to promote a substantially neutral pH.

3. Procedure of claim 1, including providing the RID material in a second compartment of the septic tank, and holding the water therein in contact with the RID material only long enough for the water to acquire dissolved ferrous ions, but not long enough for the ferrous ions to react with phosphate ions, and precipitate in significant quantity;

passing the water to a third compartment of the septic tank, and holding the water therein for a long enough residence time for the ferrous ions to react with phosphate ions, and precipitate;

the structure of the compartments being such that precipitates arising in the third compartment are deposited substantially elsewhere than on the RID material in the second compartment.

4. Procedure of claim 3, wherein a first one of the compartments of the septic tank serves to collect sludge and sediment from the water, whereby the water passing through the body of RID material in the second compartment is substantially clear of entrained solids.

5. Procedure of claim 1, wherein the water conveyed out of the septic tank still contains dissolved phosphorus, and still contains a quantity of dissolved ferrous ions;

passing that water into an aerobic treatment zone;

maintaining the water in the treatment zone under such aerobic conditions, and for such residence time, that the ferrous ions oxidise to a ferric state, and the ferric ions react with the phosphorus dissolved in the water, to produce solid ferric-phosphate minerals, which precipitate;

and conveying the treated water, having given up at least some more of its phosphorus, out of the aerobic treatment zone.

6. Procedure of claim 1, wherein the RID material is provided in such quantities in the system that, in relation to the flow of water through the system, the ferrous ions enter into solution at a concentration of at least 1 mg-Fe per litre of water.

7. Procedure of claim 1, wherein the strictly anaerobic conditions are such that the Eh voltage of the water is about +200 mV.

8. Procedure of claim 7, wherein the RID material is a mineral in respect of which, under the said conditions, the iron enters solution at a rate of no less than 0.1 mg of Fe per day, per kg of the mineral.

9. Procedure of claim 1, including the step of so configuring the septic tank that the Eh and pH conditions thereof are uniform during the flow of water therethrough.

10. Procedure of claim 1, wherein the procedure includes:
providing the body of treatment material such that the body is permeable to the flow of water therethrough;
and so configuring the body of treatment material, in the septic tank, that the water, in flowing towards the outlet conduit, passes through the permeable body of treatment material.

11. Procedure of claim 1, wherein the procedure includes:
so disposing the body of RID-material in relation to the flow of water through the septic tank that the ferrous phosphate minerals substantially do not precipitate within the body of RID-material, but substantially do precipitate at a location downstream from the body of RID material;
and so arranging the said location that the precipitates that collect therein are accessible for removal and disposal.

12. Procedure of claim 11, wherein the procedure includes:
arranging the septic tank with separate compartments;
putting the RID-material in an intermediate or second one of the compartments, between a first one of the compartments and a third one of the compartments;
the first compartment is where septic tank solids and sludge collect;
the third compartment contains the location where the ferrous phosphate minerals precipitate.

13. Procedure of claim 12, wherein the procedure includes:
locating the third compartment underneath the second compartment, being separated therefrom by a screen;
arranging the septic tank such that the flow of water goes downwards through the RID-material in the second compartment.

14. Procedure of claim 12, wherein the procedure includes:
locating the third compartment alongside the second compartment, being separated therefrom by a baffle;
arranging the septic tank such that the flow of water goes upwards through the RID material in the second compartment, then over the baffle, and then downwards through the third compartment.

15. Procedure of claim 12, wherein the procedure includes locating the second and third compartments together in a container that is physically separate from the first compartment, and conveying water from the first compartment to the separate container in a conduit.

16. Procedure for attenuating both nitrate and phosphorus from water, including:

providing a treatment chamber, and maintaining the treatment chamber under strictly anaerobic conditions;

providing a body of a solid nitrate-reducing material, and placing same in the water in the treatment chamber;

the nitrate-reducing-material is material which, under the said conditions in the treatment chamber, serves as an electron donor source, whereby nitrate in the water undergoes a reduction reaction;

providing a body of solid Reductive-Iron-Dissolution material, or RID-material, being material that consists of either ferric hydroxide or ferric oxy-hydroxide or both, and placing same in the water in the treatment chamber;

the RID-material is material that, when immersed in water having an Eh-voltage of less than 0.3 volts, releases ferrous ions into solution in the water, and the ferrous ions react with phosphorus dissolved in the water, to produce solid ferrous-phosphate minerals, which precipitate;

conducting the nitrate-and-phosphorus-contaminated water into and through the treatment-chamber, and through the bodies of nitrate-reducing material and RID-material therein;

maintaining the Eh voltage of the water in the treatment chamber below 0.3 volts during its passage through the bodies of nitrate-reducing material and RID-material;

and conveying the water, having given up at least some of its phosphorus and at least some of its nitrate, out of the treatment chamber.

17. Procedure of claim 16, wherein:

the body of a solid nitrate-reducing-material is permeable to the passage of water therethrough;

the body of RID-material is permeable to the passage of water therethrough;

the procedure includes passing the water that enters the treatment chamber through both bodies.

18. Procedure of claim 16, wherein:

the solid nitrate-reducing-material and the RID-material are physically mixed together, the mixture forming a single combined body of material;

the combined body is permeable to the passage of water therethrough;

the procedure includes passing the water in the treatment chamber through the combined body.

19. Procedure of claim 16, wherein the nitrate-reducing-material is organic carbon.

20. Procedure of claim 19, wherein the conditions in the septic tank are such as to drive the Eh-voltage down to about 0.2 volts.

* * * * *